United States Patent [19]

Solomon et al.

[11] 3,752,118

[45] Aug. 14, 1973

[54] APPARATUS FOR LIQUID EPITAXY

[75] Inventors: Raymond Solomon, Sunnyvale; Dennis De Fevere, Palo Alto, both of Calif.

[73] Assignee: Fairchild Camera and Instrument Corporation, Mountain View, Calif.

[22] Filed: Oct. 13, 1971

[21] Appl. No.: 188,785

[52] U.S. Cl. .................................. 118/422, 118/425
[51] Int. Cl. .................................. B05c 3/09
[58] Field of Search .................... 118/422, 425, 610, 118/612; 134/196, 197, 109; 228/34, 40

[56] References Cited

UNITED STATES PATENTS

| | | | |
|---|---|---|---|
| 3,139,097 | 6/1964 | Hungerford et al. ........... | 134/197 X |
| 3,478,878 | 11/1969 | Swaisgood ...................... | 118/422 X |

*Primary Examiner*—John P. McIntosh
*Attorney*—Roger S. Borovoy et al.

[57] ABSTRACT

Apparatus and method for the deposition of semiconductor material onto semiconductor wafers by immersing them in a source of liquid semiconductor material. The apparatus includes a chamber, a wafer holder, and a plug, the plug adapted to rest upon the liquid residing in the chamber during mixing of the liquid, and to be pushed through the liquid, thereby forcing the liquid to flow through the space between the plug and the walls of the chamber, that space acting as a filter to prevent solid contaminants from coming into contact with the wafers in the holder. The floating plug also serves to prevent volatilization of constituents during the mixing of the semiconductor and dopants.

4 Claims, 4 Drawing Figures

INVENTORS
RAYMOND SOLOMON
DENNIS C. DE FEVERE
BY [signature]
ATTORNEY

APPARATUS FOR LIQUID EPITAXY

BACKGROUND OF THE INVENTION

1. Field of the Invention

This invention is in the field of reaction chambers for epitaxially growing semiconductor material onto a semiconductor wafer using a liquid supply of such semiconductor material. Generally such a piece of equipment is called an "epitaxial reactor."

2. Prior Art

Epitaxial reactors for the growth of semiconductor material, particularly III–V semiconductor compounds such as gallium arsenide or gallium phosphide are described in U.S. Pat. No. 3,511,723. The particular reactor there shown is used to deposit III–V compounds in gaseous form onto a semiconductor wafer. Other reactors are known in the art for depositing epitaxial films on a semiconductor wafer using a liquid source of the semiconductor compound to be deposited rather than a gaseous source, as shown in the above patent.

Prior to the epitaxial deposition step, it is necessary to dissolve the semiconductor material to be deposited plus dopants into a liquid at or close to the temperature for epitaxial deposition. This will be referred to as the "saturation step" hereinafter. Liquid reactors, as used in the prior art, are normally open to the atmosphere. During the saturation step, some of the constituents may volatilize through the open reactor into the atmosphere and a certain amount of such material is thus lost.

Moreover, during the actual epitaxial deposition, solid particles within the liquid may be deposited onto the wafers, creating defects. It is desirable to prevent these particles from coming into contact with the wafers.

SUMMARY OF THE INVENTION

Briefly, the apparatus for deposition of semiconductor material onto semiconductor wafers by immersing them in a source of liquid semiconductor material comprises a chamber having substantially vertical walls adapted to hold a supply of liquid semiconductor material; a wafer holder adapted to fit into the chamber slideably adjacent the walls; a plug adapted to fit into the chamber also slideably adjacent the walls, leaving a small space between its periphery and the walls, the plug adapted to rest upon the liquid residing within the chamber and to be pushed through the liquid by the holder, thereby forcing liquid semiconductor material to flow through the small space between the plug and the walls, thus straining the liquid to remove solid contaminants. This small space acts as a filter to prevent solid contaminants in the liquid from coming into contact with the wafers.

The plug is also used during the saturation stage as a float on top of the liquid. The plug then suppresses the volatilization of the constituents during the mixing procedure.

DETAILED DESCRIPTION OF THE INVENTION

Figures 1, 2, 3, 4:
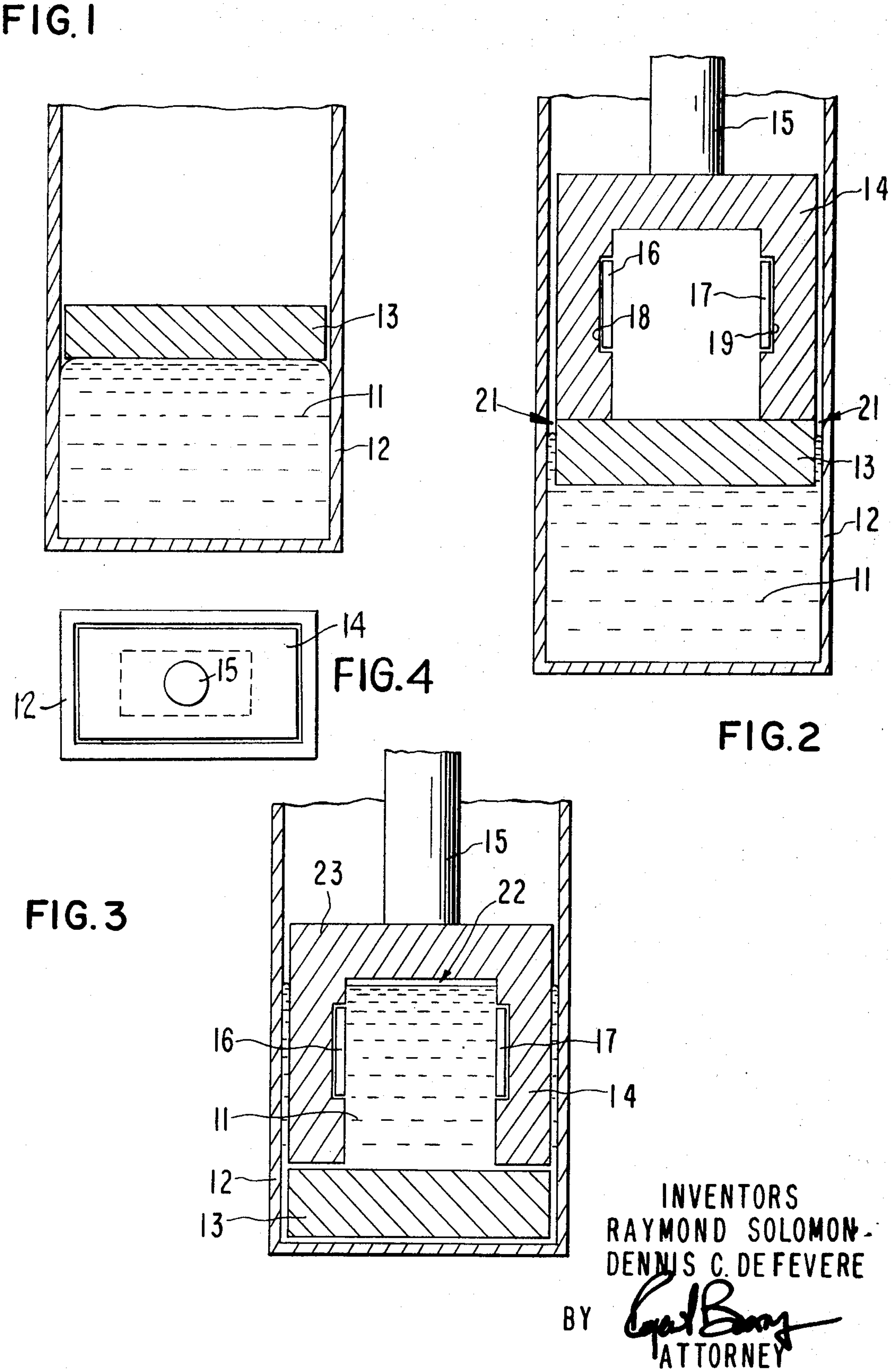
FIG. 1 shows the container containing the liquid during the saturation step.
FIG. 2 shows the wafer holder resting on top of the plug which lies on top of the liquid immediately prior to immersion of the wafers.
FIG. 3 shows the wafers immersed in the liquid semiconductor material.
FIG. 4 shows in top view the rectangular shape of one embodiment of this invention.

Referring to FIG. 1, liquid semiconductor material 11 is shown contained in epitaxial reaction chamber 12. Chamber 12 has substantially vertical walls and is rectangular in cross-section (FIG. 4). The liquid semiconductor material 11 can be any semiconductor material, preferably a III–V compound, such as gallium phosphide. Normally such semiconductor materials are first saturated before the epitaxial deposition step. This saturation step is carried out by the addition of semiconductor materials and solid or liquid dopants to a liquid 11 in chamber 12. For example, if the liquid 11 is gallium, gallium oxide, zinc and gallium phosphide powders are dissolved into the liquid 11. The liquid 11 is then heated to a temperature of between about 1,000° to 1,080° C., preferably 1,020°–1,050° C, in order to dissolve these solid constituents. A typical mixture used in the apparatus and method of the invention is a mixture of liquid gallium containing approximately 3.6–5.0 mole percent gallium phosphide semiconductor material, 0.05–1.0 mole percent $Ga_2O_3$ dopant and 0.16–0.04 mole percent zinc dopant.

To minimize the volatilization of the liquid during the step in which the gallium liquid is saturated with the gallium phosphide and the dopants, plug 13, shown in FIG. 1, having a peripheral dimension substantially corresponding to the interior dimension of chamber 12, is placed atop the liquid 11. For example, plug 13 can be a quartz slice, having the same rectangular external peripheral dimensions as the interior of chamber 12, and a thickness of about one-quarter inch. The plug 13 conforms substantially to the inside of the chamber 12, preferably with a reasonably snug slideable fit. Since most liquid III–V semiconductor materials, such as gallium phosphide, are high density materials, not unlike mercury, the quartz plug 13 will float readily on top of liquid 11.

The wafers are normally kept away from the reaction chamber 12 during the saturation step to avoid undesirable etching of the wafers by any vapors which are produced during the saturation step.

After the saturation step has been completed and the dopants and semiconductor material are completely mixed in liquid 11, wafer holder 14 is slid into chamber 12 to rest atop plug 13 as shown in FIG. 2. Note that wafer holder 14 has the same external peripheral dimensions as plug 13 and as the interior of chamber 12. Wafer holder 14 is pushed and pulled by the use of handle 15. Wafers 16 and 17 are mounted on shelves 18 and 19, respectively, and are held snugly in holder 14. As shown in FIG. 2, one surface of each of wafers 16 and 17 is exposed. At the stage shown in FIG. 2, the liquid 11 has not risen above the level of plug 13.

The epitaxial deposition procedure is then begun. The wafers are immersed in the heated, saturated liquid described above. This is accomplished by pushing on handle 15, thereby pushing holder 14 against plug 13, and pushing plug 13 down through the liquid 11. During the above pushing step, the liquid 11 is forced through the small space 21 between the outer periphery of plug 13 and the inner walls of chamber 12. While plug 13 is being pushed downwardly by holder 14, the liquid 11 flows upwardly through space 21, and the space 21 acts as a filter to prevent solid contaminants, such as excess gallium phosphide or excess $Ga_2O_3$ and other scum in liquid 11 from coming up into contact with wafers 16 and 17 in the wafer holder 14. These solid contaminants are trapped below the lower surface of plug 13.

As holder 14 is pushed downwardly, the liquid 11 rises to the level 22 shown in FIG. 3, fully immersing wafers 16 and 17, as shown. At this point, plug 13 comes to rest at the bottom of chamber 12. Wafer holder 14 is resting atop plug 13. At the stage shown in FIG. 3, the liquid is being epitaxially deposited on the interior surfaces of wafers 16 and 17 as long as deposition temperatures are maintained. During deposition, the furnace is cooled at a rate of approximately 1°–10° C/min, preferably 3°–8° C per minute until a temperature of about 400°–600° C is reached.

After deposition, it is preferable to employ an annealing step. This can readily be carried out in the apparatus of the invention at the final temperature of about 400°–600° C, preferably about 500° C, while retaining the wafers 16 and 17 and holder 14 within the liquid 11, as shown in FIG. 3. Annealing in this manner can be carried out for approximately 18 to 20 hours, preferably about 10 hours. Alternatively, if desired, holder 14 can be removed from chamber 12 while the temperature of the liquid is reduced to the annealing temperature, and then replaced into chamber 12 when the annealing temperature is reached and maintained.

It is apparent from viewing FIG. 3 that the apparatus of the invention also prevents volatilization of liquid material 11 during the epitaxial growth procedure itself. Although plug 13 is resting on the bottom of chamber 12, and no longer serves to prevent such volatilization, the top portion 23 of holder 14, having substantially the same cross-section as plug 13, serves to prevent volatilization of the liquid 11 during the epitaxial growth step.

Volatilization of the liquid 11 is kept to a minimum by the apparatus of the subject invention throughout the entire process. During the mixing procedure shown in FIG. 1, wherein the dopants and semiconductor material are admixed with the liquid, volatilization is minimized by plug 13. During the immersion step shown in FIG. 2, volatilization is minimized by a combination of plug 13 and holder 14. Finally, during the epitaxial growth stage, shown in FIG. 3, volatilization is minimized by the holder 14 itself.

Finally, after growth and annealing have been completed, the wafers are removed by lifting up on handle 14 and removing holder 14 from the solution. The wafers 16 and 17 are held in a vertical position during the removal step so that the solution 11 readily flows off the surface of the wafers as holder 14 is being removed from the solution.

In a preferred embodiment of the invention, holder 14 is U-shaped, as shown. Obviously other shapes could be used. It is important however that the locations for holding the wafers are at the interior of the holder so that the holder itself can serve to prevent volatilization during the growth stage. Other shapes can be used for the chamber; it is only necessary that the external dimensions of plug 13 and holder 14 are shaped to conform with the internal dimensions of the chamber. In this regard, a rectangular, cylindrical, square, or other shaped chamber may be employed.

The apparatus and method of the invention provide improved control of temperature gradients and have been found to maintain these temperature gradients in the proper direction to prevent supercooling of the semiconductor constituents. The apparatus also minimizes the amount of semiconductor material lost by volatilization and thus required for epitaxial deposition.

What is claimed is:

1. Apparatus for deposition of semiconductor material onto semiconductor wafers by immersing them in a source of liquid semiconductor material comprising:
   - a chamber having substantially vertical walls adapted to hold a supply of high temperature liquid semiconductor material;
   - an inverted U-shaped wafer holder having indentations on its inside faces adapted to hold the wafers, said holder being adapted to fit into said chamber slideably adjacent said walls, the top of said inverted U-being above the level of said wafers, thereby overlying the top of said liquid supply to prevent volatilization;
   - a solid plug adapted to fit into said chamber slideably adjacent said walls, leaving a small space between its periphery and said walls, said plug adapted to rest upon liquid residing within said chamber and to be pushed through such liquid by said holder, thereby forcing liquid to flow through said small space, said small space acting as a filter to prevent any solid contaminants in said liuqid from coming into contact with the wafers in said holder.

2. The apparatus of claim 1 further characterized by there being four walls arranged in a rectangle.

3. The apparatus of claim 2 further characterized by said holder and said plug having rectangular cross-sections.

4. The apparatus of claim 3 further characterized by said holder and said plug having substantially the same perimeter.

* * * * *